US012228395B2

(12) United States Patent
Matsushita et al.

(10) Patent No.: US 12,228,395 B2
(45) Date of Patent: Feb. 18, 2025

(54) SUBSTRATE POSITION CALIBRATION FOR SUBSTRATE SUPPORTS IN SUBSTRATE PROCESSING SYSTEMS

(71) Applicant: Applied Materials, Inc., Santa Clara, CA (US)

(72) Inventors: Tomoharu Matsushita, Chiba (JP); Aravind Kamath, San Jose, CA (US); Jallepally Ravi, San Ramon, CA (US); Cheng-Hsiung Tsai, Cupertino, CA (US); Hiroyuki Takahama, Chiba-ken (JP)

(73) Assignee: APPLIED MATERIALS, INC., Santa Clara, CA (US)

( * ) Notice: Subject to any disclaimer, the term of this patent is extended or adjusted under 35 U.S.C. 154(b) by 112 days.

(21) Appl. No.: 17/530,538

(22) Filed: Nov. 19, 2021

(65) Prior Publication Data
US 2022/0099426 A1    Mar. 31, 2022

Related U.S. Application Data

(63) Continuation-in-part of application No. 15/468,509, filed on Mar. 24, 2017, now Pat. No. 11,201,078.
(Continued)

(51) Int. Cl.
*G01B 5/004* (2006.01)
*H01L 21/68* (2006.01)
(Continued)

(52) U.S. Cl.
CPC .............. *G01B 5/004* (2013.01); *H01L 21/68* (2013.01); *H01L 21/6838* (2013.01); *B25J 11/0095* (2013.01)

(58) Field of Classification Search
CPC ...... G01B 5/004; H01L 21/68; H01L 21/6838
(Continued)

(56) References Cited

U.S. PATENT DOCUMENTS 4,200,794 A    4/1980 Newberry et al.
4,516,253 A    5/1985 Novak
(Continued)

FOREIGN PATENT DOCUMENTS

JP    2002-246444 A    8/2002
JP    2007-305627 A    11/2007
(Continued)

OTHER PUBLICATIONS

International Search Report for PCT/US2022/050209, dated Mar. 29, 2023.

*Primary Examiner* — Alexander A Mercado
*Assistant Examiner* — Rodney T Frank
(74) *Attorney, Agent, or Firm* — Moser Taboada

(57) ABSTRACT

Methods and apparatus for substrate position calibration for substrate supports in substrate processing systems are provided herein. In some embodiments, a method for positioning a substrate on a substrate support includes: obtaining a plurality of backside pressure values corresponding to a plurality of different substrate positions on a substrate support by repeatedly placing a substrate in a position on the substrate support, and vacuum chucking the substrate to the substrate support and measuring a backside pressure; and analyzing the plurality of backside pressure values to determine a calibrated substrate position.

20 Claims, 5 Drawing Sheets

Related U.S. Application Data

(60) Provisional application No. 62/458,889, filed on Feb. 14, 2017.

(51) Int. Cl.
    *H01L 21/683*     (2006.01)
    *B25J 11/00*     (2006.01)

(58) Field of Classification Search
    USPC ............................................................ 73/37
    See application file for complete search history.

(56) References Cited

U.S. PATENT DOCUMENTS

| | | |
|---|---|---|
| 5,643,366 A | 7/1997 | Somekh |
| 6,063,440 A | 5/2000 | Chen et al. |
| 6,577,923 B1 | 6/2003 | White et al. |
| 2001/0011900 A1 | 8/2001 | Hembree et al. |
| 2002/0130276 A1 | 9/2002 | Sogard |
| 2003/0127605 A1 | 7/2003 | Kondo |
| 2003/0213382 A1 | 11/2003 | Kendale et al. |
| 2004/0016637 A1 | 1/2004 | Yang et al. |
| 2004/0177917 A1 | 9/2004 | Adachi |
| 2004/0207836 A1 | 10/2004 | Chhibber et al. |
| 2005/0065634 A1 | 3/2005 | Nakajima et al. |
| 2005/0142846 A1 | 6/2005 | Frodis et al. |
| 2005/0226779 A1 | 10/2005 | Oldham et al. |
| 2005/0260295 A1 | 11/2005 | Choi et al. |
| 2005/0280811 A1 | 12/2005 | Sandell |
| 2006/0062897 A1 | 3/2006 | Gu et al. |
| 2006/0130750 A1 | 6/2006 | Ishikawa et al. |
| 2007/0076345 A1 | 4/2007 | Bang et al. |
| 2008/0032426 A1* | 2/2008 | Michaelson ............ H01L 22/12 257/E21.53 |
| 2009/0087932 A1 | 4/2009 | Kondoh |
| 2009/0197356 A1 | 8/2009 | Bang et al. |
| 2010/0003904 A1 | 1/2010 | Duescher |
| 2011/0104903 A1 | 5/2011 | Takase |
| 2011/0132086 A1 | 6/2011 | Wang |
| 2014/0209596 A1 | 7/2014 | Lubomirsky et al. |
| 2015/0109600 A1 | 4/2015 | Mizumoto |
| 2015/0214085 A1 | 7/2015 | Jin et al. |
| 2015/0255258 A1 | 9/2015 | Nozawa et al. |
| 2016/0079105 A1 | 3/2016 | Parkhe |
| 2016/0325284 A1 | 11/2016 | Camillo |
| 2022/0099426 A1 | 3/2022 | Matsushita et al. |

FOREIGN PATENT DOCUMENTS

| | | |
|---|---|---|
| JP | 2016209981 A | 12/2016 |
| KR | 2003-0053342 A | 6/2003 |
| KR | 10-2008-0017212 A | 2/2008 |
| TW | 201332051 A1 | 8/2013 |
| WO | WO 2011/099848 A2 | 8/2011 |

* cited by examiner

SUBSTRATE POSITION CALIBRATION FOR SUBSTRATE SUPPORTS IN SUBSTRATE PROCESSING SYSTEMS

CROSS-REFERENCE TO RELATED APPLICATIONS

This application is a continuation-in-part of U.S. patent application Ser. No. 15/468,509, filed Mar. 24, 2017, which claims the benefit of U.S. Provisional Application Ser. No. 62/458,889, filed Feb. 14, 2017, the entire contents of which are incorporated by reference herein.

FIELD

Embodiments of the present disclosure generally relate to substrate processing systems, and more particularly, to positioning of substrates on a substrate support in such processing systems.

BACKGROUND

In conventional substrate processing systems, such as in microelectronic device fabrication, fine adjustment of substrate positioning on a substrate support is often needed to minimize process non-uniformity caused by incorrect substrate placement on the substrate support. One technique for checking the position of the substrate is by running a process and analyzing a process contour map. Process non-uniformities caused by incorrect substrate placement can be subsequently addressed to improve process non-uniformity by altering the substrate placement based upon the analysis of the process contour map. Such substrate placement calibration can be performed at start up or after substrate support replacement. However, the inventors have observed difficulty in determining how much adjustment is required for the substrate transfer robot (e.g., extension and rotation steps). The inventors have also discovered that the result depends on the person performing the calibration and that the required iteration of substrate processes, measurements, analysis, and substrate transfer robot hand off adjustments are time consuming.

Therefore, the inventors have provided improved methods and apparatus for substrate position calibration on a substrate support.

SUMMARY

Methods and apparatus for substrate position calibration for substrate supports in substrate processing systems are provided herein. In some embodiments, a method for positioning a substrate on a substrate support includes: obtaining a plurality of backside pressure values corresponding to a plurality of different substrate positions on a substrate support by repeatedly placing a substrate in a position on the substrate support, and vacuum chucking the substrate to the substrate support and measuring a backside pressure; and analyzing the plurality of backside pressure values to determine a calibrated substrate position.

In some embodiments, an apparatus for calibrating a substrate position on a substrate support having a vacuum chuck includes: a calibration substrate comprising a solid disc having a plurality of through holes disposed through the solid disc along a circle having a diameter proximate an outer diameter of the solid disc.

In some embodiments, an apparatus for calibrating a substrate position on a substrate support having a vacuum chuck includes: a calibration substrate comprising a solid disc having a diameter of about 150 mm, about 200 mm, about 300 mm, or about 450 mm, and a thickness of about 450 micrometers to about 1500 micrometers, wherein the solid disc is fabricated from quartz, silicon, silicon carbide, or aluminum nitride; and a plurality of through holes disposed through the solid disc proximate an outer diameter of the solid disc.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
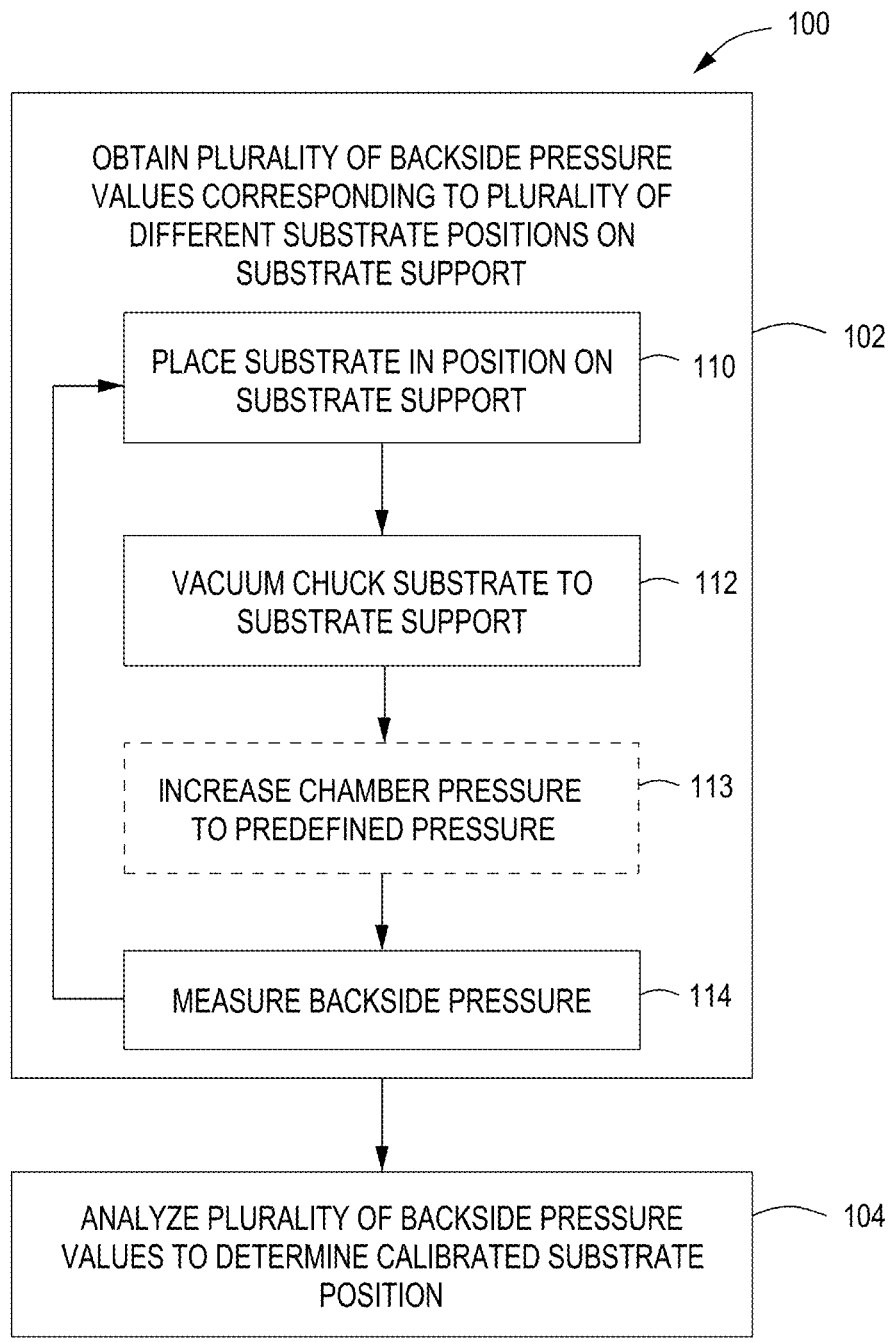
FIG. 1 is a flow chart of a method of positioning a substrate on a substrate support in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for substrate position calibration for substrate supports in substrate processing systems are provided herein. The inventive methods and apparatus advantageously facilitate calibration of substrate position on a substrate support without performing any process on the substrate. The inventive techniques further advantageously eliminate the requirement of analyzing process results and process contour mapping. The inventive techniques are further advantageously more repeatable and thus reduce or eliminate variation of results dependent upon the operator performing the calibration.

FIG. 1 is a flow chart of a method 100 of positioning a substrate on a substrate support in accordance with at least some embodiments of the present disclosure. FIGS. 2-9 depict various embodiments of processing equipment used in connection with the method 100 and are described in greater detail below. The method 100 may be performed at any time when a substrate is to be disposed on a substrate support for processing. In some embodiments, the method 100 may be performed at the beginning of a run of substrates, after maintenance, repair, or installation of the substrate support, after maintenance, repair, or installation of a substrate transfer robot that places the substrate the substrate support, after bringing the processing chamber on-line after being shut down, after a change in process temperature for a process to be performed, or at any time that the position of the substrate on the substrate support appears to be incorrect.

Figure 2:
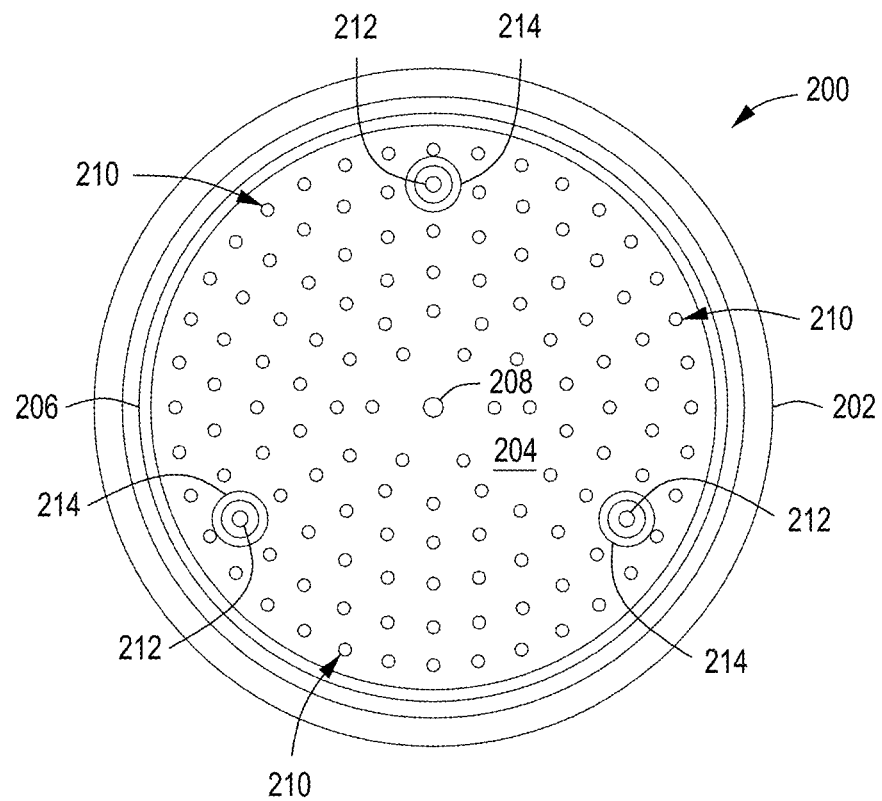
FIG. 2 is a schematic top view of a substrate support used in connection with a method of positioning a substrate on a substrate support in accordance with at least some embodiments of the present disclosure.

For example, FIG. 2 is a schematic top view of a substrate support suitable for use in connection with the method 100 in accordance with at least some embodiments of the present disclosure. The configuration and arrangement of components of the substrate support shown in FIG. 2 is merely exemplary and not meant to be limiting. As depicted in FIG. 2, a substrate support 200 is a vacuum chuck having a body 202 including a vacuum region 204 defined between support structures of the substrate support 200.

For example, an outer seal band, or seal ring 206, is provided having an outer diameter larger than that of a substrate to be supported and an inner diameter less than that of the substrate to be supported such that a vacuum may be maintained within the vacuum region when a substrate is properly positioned atop the seal ring 206. In some embodiments, a plurality of support pins 210 may be arranged atop the support surface within the vacuum region 204. A plurality of lift pin openings 212 may also be provided to facilitate lift pins to selectively raise and lower the substrate onto the substrate support 200. In embodiments where the lift pins do not form a seal with the substrate support, corresponding lift pin seal rings 214 may be provided to limit or prevent leakage from the lift pin openings 212 into the vacuum region 204. Upper surfaces of the seal ring 206, support pins 210, and lift pin seal rings 214 collectively form support surfaces for the substrate when placed on the substrate support. At least one opening 208 is provided to couple the vacuum region 204 to a vacuum source (e.g., pump 310 shown in FIG. 3).

Figure 3:
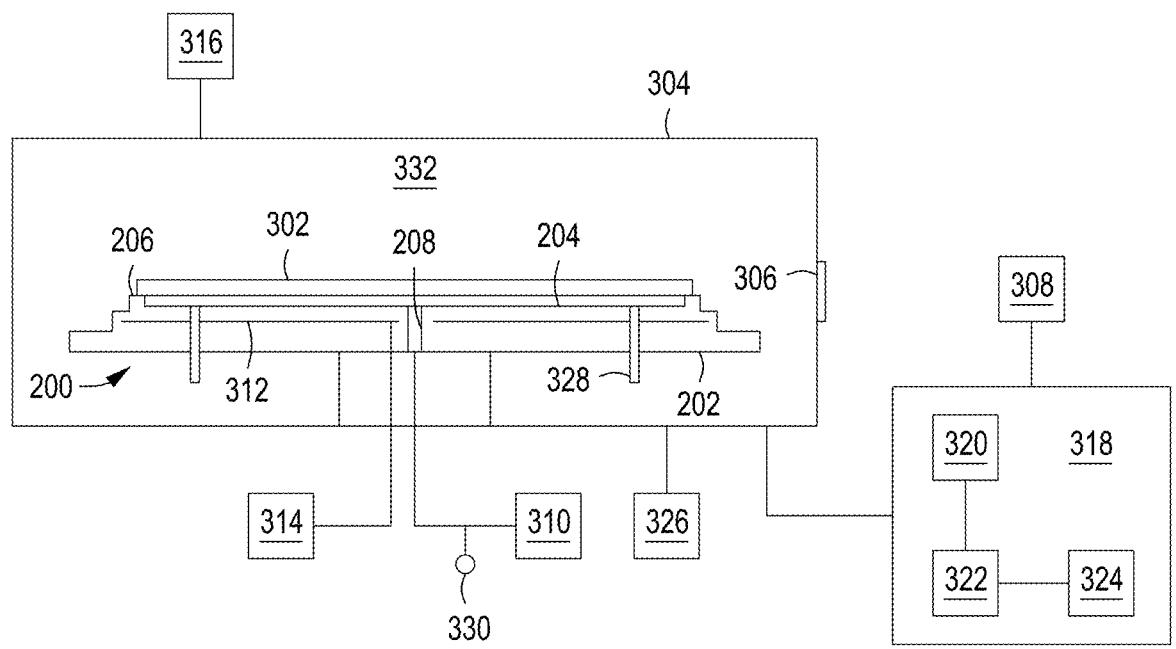
FIG. 3 is a schematic side view of a process chamber used in connection with a method of positioning a substrate on a substrate support in accordance with at least some embodiments of the present disclosure.

FIG. 3 is a schematic side view of a process chamber suitable for use in connection with the method 100 in accordance with at least some embodiments of the present disclosure. The configuration and arrangement of components of the process chamber shown in FIG. 3 is merely exemplary and not meant to be limiting. In addition, conventional components or other details not necessary for the understanding of the disclosure are omitted from the Figures so as not to obscure the disclosure. As depicted in FIG. 3, a process chamber 304 contains a substrate support, such as the substrate support 200 discussed above in an interior volume 332 of the process chamber 304. As noted above, the substrate support 200 is a vacuum chuck and is coupled to a vacuum source, such as pump 310 or other suitable vacuum source. A pressure sensor, such as a pressure gauge 330 is operatively coupled to the vacuum region 204 to measure the backside pressure in the vacuum region 204. In some embodiments, the substrate support 200 may further include a heater, such as resistive heater 312 coupled to heater power source 314. A substrate 302 is shown disposed on the seal ring 206 of the substrate support 200.

The process chamber 304 includes an opening, such as a slit valve 306 that selectively opens the process chamber 304 to facilitate moving substrates into and out of the interior volume 332 of the process chamber 304, for example, via a substrate transfer robot 308. Control of the substrate transfer robot 308 facilitate control of the position of the substrate 302 over the substrate support 200, and ultimately, of the position of the substrate 302 on the substrate support 200 when transferred from the substrate transfer robot 308 to the substrate support 200. A plurality of lift pins 328 may be provided to assist in the transfer of the substrate 302 between the substrate transfer robot 308 and the substrate support 200.

The process chamber 304 is configured for performing one or more of a variety of processes, such as deposition processes. A gas source 316 is coupled to the interior volume of the process chamber 304 to provide process gases needed for substrate processing (e.g., deposition). In addition, the gas source 316 provides at least one inert gas, such nitrogen gas or a noble gas (such as argon or the like). A pump 326 is coupled to the interior volume 332 of the process chamber 304 to maintain a desired pressure within the process chamber and to remove process gases and processing byproducts during processing.

In some embodiments, to facilitate control of the process chamber 304, a controller 318 is coupled to components of the process chamber 304, including the pressure gauge 330, the substrate transfer robot 308, and the like. The controller 318 may be any form of general-purpose computer processor that can be used in an industrial setting for controlling various chambers and sub-processors. The controller includes a central processing unit (CPU) 320, memory 322, and support circuits 324. The memory, or computer-readable medium, 322 of the CPU 320 may be one or more of readily available memory such as random access memory (RAM), read only memory (ROM), floppy disk, hard disk, or any other form of digital storage, local or remote. The support circuits 324 are coupled to the CPU 320 for supporting the processor in a conventional manner. These circuits include cache, power supplies, clock circuits, input/output circuitry and subsystems, and the like. One or more methods and/or processes may generally be stored in the memory 322 as a software routine that, when executed by the CPU 320, causes the process chamber 304 to perform processes, such as the substrate positioning methods disclosed herein and other processes (such as deposition processes). For example, the method 100 described herein may be automatedly performed under control of the controller 318, with the calibrated substrate transfer robot handoff position stored for repeated use for transferring substrates until recalibration is desired.

The method 100 generally begins at 102, where a plurality of backside pressure values are obtained at a corresponding a plurality of different substrate positions on a substrate support. Each backside pressure value is obtained by placing a substrate in a position on a substrate support, as indicated at 110, vacuum chucking the substrate to the substrate support, as indicated as 112, and measuring a backside pressure, as indicated at 114. To facilitate vacuum chucking, a pressure in the interior volume 332 of the process chamber is maintained at a pressure above that in the vacuum region 204, such as at least about 1 Torr about above the pressure in the vacuum region 204. For example, in some embodiments, while vacuum chucking the substrate, a pressure within the process chamber containing the substrate support (and the substrate) is maintained at about 5 Torr (although other pressures could also be used). In some embodiments, the pressure is maintained while flowing an inert gas, such nitrogen gas or a noble gas (e.g., argon or the like), within the process chamber. In some embodiments, the pressure within the process chamber is optionally increased to a predefined pressure prior to measuring backside pressure, as indicated at 113. In some embodiments, the predefined pressure is about 20 to about 40 Torr (although other pressures could also be used). In some embodiments, the substrate support may be heated to a first temperature during the placing of the substrate, vacuum chucking of the substrate, and measuring of the backside pressure values. In some embodiments, the first temperature is a temperature at which a subsequent process (e.g., such as a deposition process) is to be performed.

The placing and chucking of the substrate on the substrate support and the measuring of the corresponding backside pressure is repeated at different substrate positions, obtained by controlling parameters of a substrate transfer robot that places the substrate on the substrate support (for example, substrate transfer robot 308). The plurality of substrate positions are obtained by adjusting a hand off position of a substrate transfer robot that moves the substrate into the process chamber and positions the substrate over the substrate support. For example, by controlling the extension and/or rotation of the substrate transfer robot (or other parameters that impact the position of the substrate with respect to the substrate support), various positions of the substrate on the substrate support may be obtained and the corresponding backside pressure may be measured.

Figure 10:
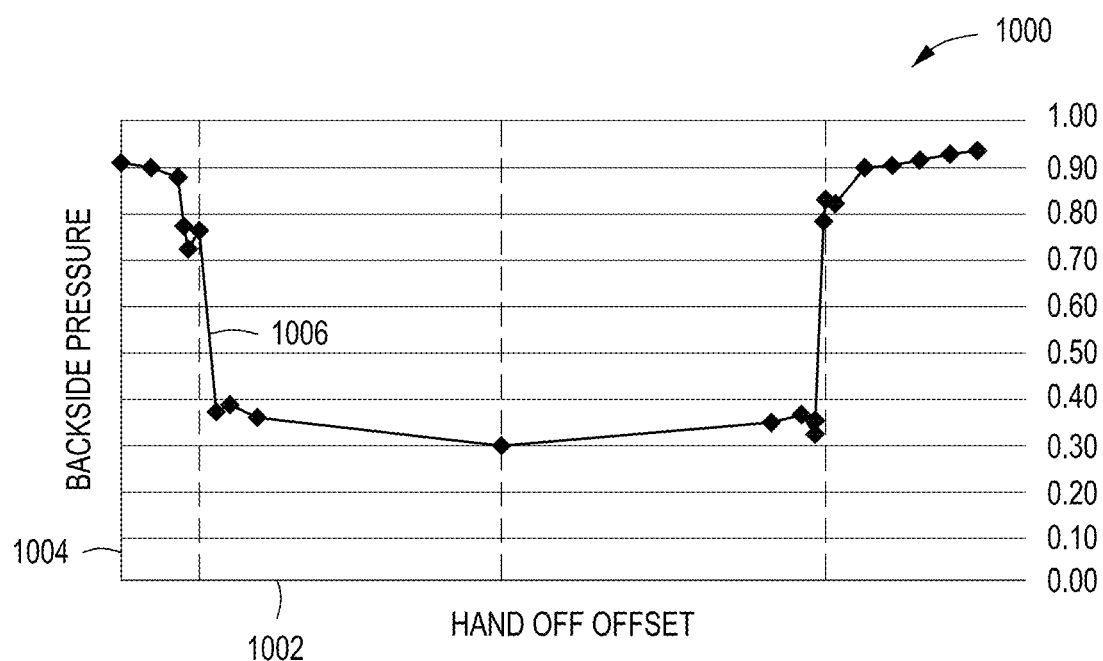
FIG. 10 is a graph of backside pressure values versus substrate position in connection with a method of positioning a substrate on a substrate support in accordance with at least some embodiments of the present disclosure.
Figure 11:
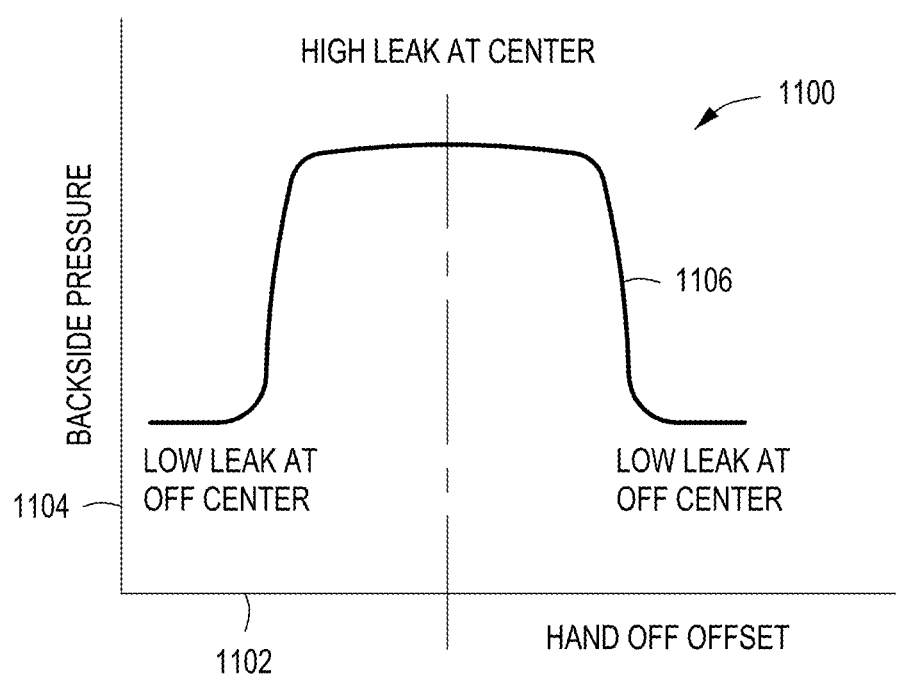
FIG. 11 is an illustrative graph of backside pressure versus substrate position in connection with a method of positioning a substrate on a substrate support in accordance with at least some embodiments of the present disclosure.

After obtaining the plurality of backside pressure values, the plurality of backside pressure values are analyzed to determine a calibrated substrate position, as indicated at 104. For example, FIGS. 10 and 11 are graphs of backside pressure values obtained and used in connection with a method of positioning a substrate on a substrate support in accordance with at least some embodiments of the present disclosure. As shown in FIGS. 10 and 11, a measured backside pressure varies dependent upon the hand-off offset (or position) of the substrate transfer robot. The position of the substrate transfer robot determines the position of the substrate positioned over the substrate support, and hence the position of the substrate on the substrate support when the transfer is complete. FIGS. 10-11 depict exemplary data based upon lateral hand-off offset. However, the hand-off offset (or position) of the substrate transfer robot can be varied in two dimensions along a substrate transfer plane parallel to the substrate support surface to obtain more precise substrate positioning data. Control of the substrate transfer robot can be along x-y coordinates within the substrate transfer plane, using extension and rotation coordinates within the substrate transfer plane, or any other suitable parameters of substrate hand off position control.

When a substrate is positioned on the substrate support and vacuum pressure is applied to retain the substrate, the backside pressure will increase with increases in leaks from the interior volume of the process chamber into the vacuum region of the substrate support (e.g., an increase in the leak rate). In some embodiments, a calibration substrate can be a standard-sized substrate (e.g., a substrate having dimensions equivalent to a substrate for which the substrate support was designed to support, such as standard semiconductor wafer sizes, for example, about 450 mm, about 300 mm, about 200 mm, about 150 mm, or the like.) The calibration substrate is intended to be handled by the same equipment as production substrates and thus has a thickness similar to standard semiconductor wafers (e.g., from about 450 micrometers to about 1500 micrometers). The calibration substrate may be fabricated from any process-compatible materials, such as quartz, silicon, silicon carbide, aluminum nitride, or the like.

In some embodiments, the calibration substrate is solid (e.g., has no through holes or perforations formed thereon). In such embodiments, the calibration substrate can be a production substrate (e.g., a silicon or semiconductor substrate upon which a subsequent process is to be performed in the same process chamber). In some embodiments, the calibration substrate can be a non-production substrate. In some embodiments, the calibration substrate can be a blank substrate. The blank substrate can be formed of a homogenous material and may be uncoated or uniformly coated.

Figure 4:
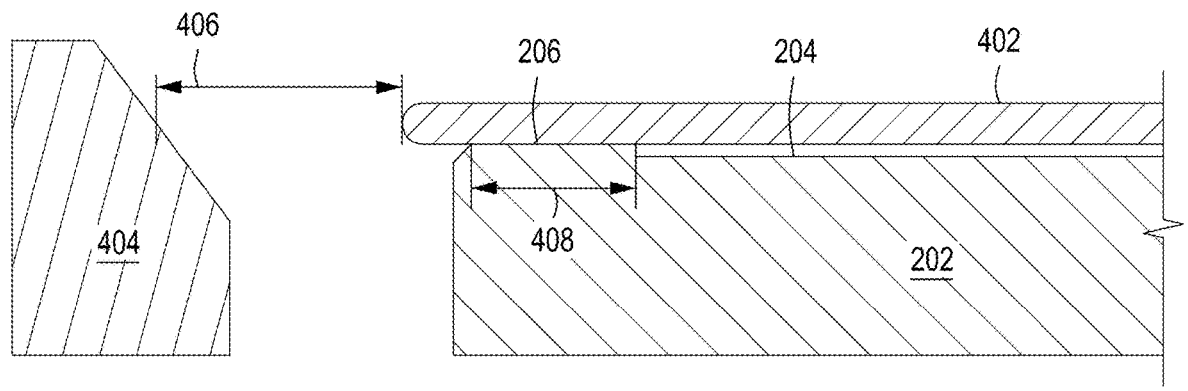
FIG. 4 is a schematic partial side view of a substrate support and substrate used in connection with a method of positioning a substrate on a substrate support in accordance with at least some embodiments of the present disclosure.

For example, FIG. 4 is a schematic partial side view of a substrate support and substrate used in connection with a method of positioning a substrate on a substrate support in accordance with at least some embodiments of the present disclosure. The substrate support shown in FIG. 4 can be as described with respect to FIGS. 2-3 above. As shown in FIG. 4, when a substrate 402 (which is a solid substrate) is positioned on the substrate support, a backside of the substrate is disposed atop the seal ring 206. When the substrate 402 is perfectly positioned on the substrate support, a center of the substrate is aligned with a center of the seal ring 206 (e.g., they are concentric) and the edge of the substrate and the outer diameter of the seal ring are equidistantly spaced apart around the entire circumference of the substrate. However, when the substrate 402 is incorrectly positioned on the substrate support, the edge of the substrate is not centered with respect to the seal ring 206 and one edge may be either disposed atop a smaller portion of the seal ring 206 or may be completely off of the seal ring 206. Such misalignment causes varying leaks from the internal volume of the process chamber into the vacuum region 204 (the amount of leakage dependent upon the amount of misalignment).

In addition, other components within the process chamber, such as edge ring 404 may be disclosed around the substrate support, limiting the amount of possible misalignment of the substrate 402 atop the substrate support. In some embodiments, a width 408 of the seal ring is small enough and a distance 406 between the outer edge of the substrate and an adjacent process chamber component (e.g., the edge ring 404) is large enough, such that there is sufficient room for substrate mis-position to create a large enough leak to measurably impact the backside pressure.

For example, FIG. 10 depicts a graph 1000 showing a plot 1006 of substrate transfer robot hand off offset (axis 1002) versus backside pressure (axis 1004). As seen, the plot 1006 shows that a centered position of the substrate transfer robot hand off corresponds to the lowest backside pressure measurement. Increasing offset of the substrate transfer robot in either direction results in greater leaks and thus higher backside pressure readings. At large enough substrate transfer robot hand off offsets, the edge of the substrate moves off of the seal ring and the backside pressure increases rapidly, as seen by the nearly vertical portions of plot 1006. Thus, in some embodiments, a plurality of backside pressure values can be analyzed to determine a substrate position having an associated backside pressure value that is a minimum value of the plurality of backside pressure values or that is within a predetermined tolerance of the minimum value of the plurality of backside pressure values.

For example, referring to FIG. 10, the substrate may be placed at a first hand off position of a range of hand off positions and a backside pressure measurement may be taken at the first hand off offset position (e.g., corresponding to the left-most or right-most elevated backside pressure plot point in FIG. 10). The hand off offset may then be changed to various positions in one direction of the first hand off position and a backside pressure measurement may be taken at each position to obtain the plot 1006 shown in FIG. 10. The backside pressure measurements may be stopped when the plot 1006 depicts a rapid decrease in backside pressure values, an increase in backside pressure values, a minimum backside pressure value therebetween, and continued elevated backside pressure values after the increase in backside pressure values. In another example, referring to FIG. 10, the substrate may be placed at a second hand off position of a range of hand off positions, wherein the second hand off position is near a center of the range of hand off positions. For example, as depicted in FIG. 10, such a second hand off position can have an associated backside pressure in the range of about 0.30 to about 0.40. The hand off offset may then be changed to various positions in a first direction of the second hand off position and backside pressure measurements taken at each of the various positions until the backside pressure values increase (as indicated by the nearly vertical portion of plot 1006 on one side of the minimum value of 0.30). The hand off offset may then be changed to various position in a second direction opposite the first direction until the plot 1006 depicts an increase in backside pressure values (as indicated by the nearly vertical portion of plot 1006 on an opposite side of the minimum value of 0.30). A calibrated substrate position may be determined to be associated with hand off offset positions corresponding with a minimum backside pressure value or backside pressure values that are disposed between the nearly vertical portions of plot 1006 on either side of the minimum value.

In some embodiments, the size of the gap between the edge of the substrate and the edge ring is small enough and the width of the seal ring is large enough such that there is no substantial leak between the substrate and the seal ring regardless of the position of the substrate on the substrate support due to the limited lateral range of motion of the substrate.

Figure 5:
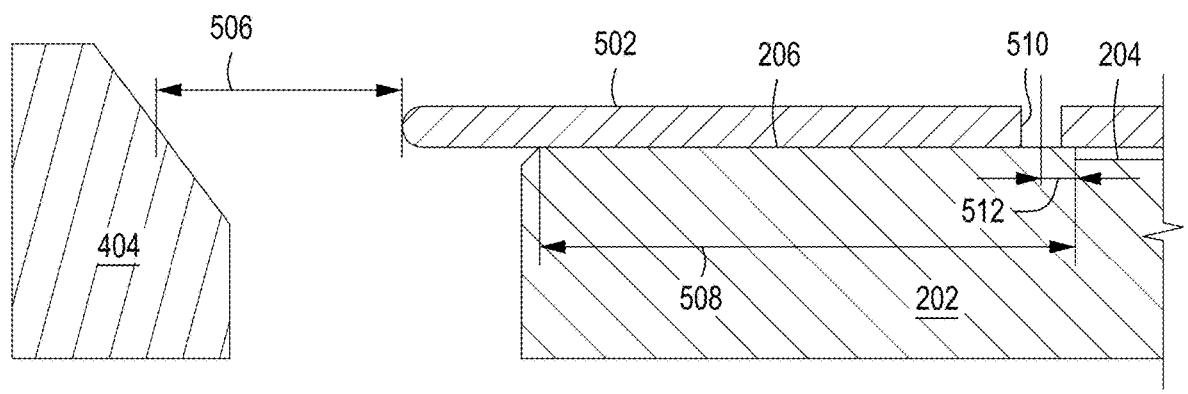
FIG. 5 is a schematic partial side view of another substrate support and substrate used in connection with a method of positioning a substrate on a substrate support in accordance with at least some embodiments of the present disclosure.

For example, FIG. 5 depicts a schematic partial side view of a substrate support and substrate used in connection with a method of positioning a substrate on a substrate support in accordance with at least some embodiments of the present disclosure. The substrate support shown in FIG. 5 can be as described with respect to FIGS. 2-3 above. As shown in FIG. 5, when a substrate 502 is positioned on the substrate support, a backside of the substrate is disposed atop the seal ring 206. When the substrate 502 is perfectly positioned on the substrate support, a center of the substrate is aligned with a center of the seal ring 206 (e.g., they are concentric) and the edge of the substrate and the outer diameter of the seal ring are equidistantly spaced apart around the entire circumference of the substrate. However, in embodiments consistent with FIG. 5, a width 508 of the seal ring is large enough in relation to a distance 506 between the outer edge of the substrate and an adjacent process chamber component (e.g., the edge ring 404) such that misalignment of a solid substrate may not cause a leak into the vacuum region 204 sufficient to determine the proper position based upon backside pressure measurements, or the leak may be small enough such that the determination may be more difficult and less precise.

Accordingly, in some embodiments, the substrate 502 may include a plurality of through holes 510 disposed through a portion of the substrate corresponding to the location of the seal ring. As used herein, corresponding to the location of the seal ring means that the through holes will be disposed atop the seal ring when the substrate is centered atop the substrate support. Each of the through holes 510 may have a diameter selected to allow sufficient leakage to facilitate the measurements as described herein. In some embodiments, the through holes 510 may have a diameter of about 0.02 inches (about .5 mm) to about 0.07 inches (about 1.8 mm), or from about 0.03 inches (about .75 mm) to about 0.04 inches (about 1 mm). In some embodiments, the through holes 510 are positioned along a circle having a diameter proximate to but greater than an inner diameter of the seal ring (as shown in FIG. 5). The through holes 510 are positioned such that a distance 512 between the center of the through hole and the edge of the seal ring (e.g., the inner diametral edge as shown in FIG. 5) is selected to allow for leakage into the vacuum region 204 from the interior volume of the process chamber through the through hole 510 when the substrate 502 is positioned off-center on the substrate support. For example, in some embodiments, on a 12 inch (300 mm) substrate, the through holes 510 may be arranged with their respective centers on a circle having a diameter of about 10.939 inches (about 277.85 mm) to about 11.515 inches (292.48 mm), such as at about 10.95 inches (about 278.13 mm). Hole positions can be scaled to substrates of other sizes.

Accordingly, when the substrate 502 is incorrectly positioned on the substrate support, one or more of the through holes 510 are positioned close to the inner edge of the seal ring 206 or past the edge of the seal ring 206 and over the vacuum region 204. Such misalignment causes varying leaks from the internal volume of the process chamber into the vacuum region 204 (the amount of leakage dependent upon the amount of misalignment). Such variation in backside pressure readings based upon substrate position can be analyzed similar to obtain a graph similar to the plot 1006 shown in FIG. 10, where increasing off set results in increased backside pressure readings.

Alternatively, in some embodiments, the position of the through holes are reversed such that they are disposed over the vacuum region when the substrate is centered on the substrate support, but at least one through hole is covered when the substrate is mis-positioned on the substrate support. For example, in some embodiments, a substrate 602 may include a plurality of through holes 610 disposed through a portion of the substrate corresponding to the vacuum region 204 and proximate to the location of the seal ring 206. As used herein, corresponding to the location of the vacuum region means that the through holes will be disposed over the vacuum region when the substrate is centered atop the substrate support. As used herein, proximate to the location of the seal ring means that the through holes are disclosed close enough to the seal ring such that one or more of the through holes can be disposed atop the seal ring when the substrate is disposed off-center atop the substrate support.

Figure 6:
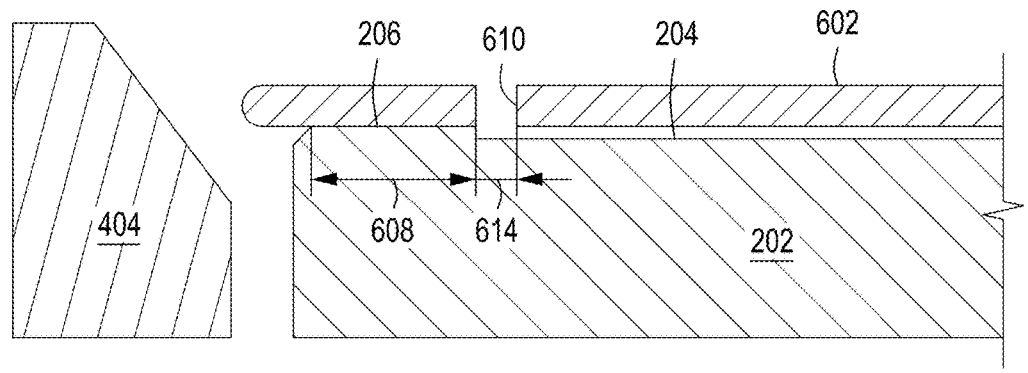
FIG. 6 is a schematic partial side view of another substrate support and substrate used in connection with a method of positioning a substrate on a substrate support in accordance with at least some embodiments of the present disclosure.

In some embodiments, the through holes 610 are positioned along a circle having a diameter proximate to but less than the inner diameter of the seal ring (as shown in FIG. 6). The through holes 610 are positioned such that a diameter 614 of the through hole is completely or predominantly disposed over the vacuum region and proximate the edge of the seal ring (e.g., the inner diametral edge as shown in FIG. 6) when the substrate 602 is centered on the substrate support. The through holes 610 are further positioned such that one or more through holes 610 can move past the edge of the seal ring (e.g., the inner diametral edge as shown in FIG. 6) to allow for reducing the leakage into the vacuum region 204 from the interior volume of the process chamber through the through hole 610 when the substrate 602 is positioned off-center on the substrate support.

Accordingly, when the substrate 602 is incorrectly positioned on the substrate support, one or more of the through holes 610 are positioned partially or completely atop the seal ring 206, partially or completely blocking leakage from the internal volume of the process chamber into the vacuum region 204 through the through hole 610. Various amounts of misalignment causes varying amounts of leakage blocking from the internal volume of the process chamber into the vacuum region 204 (the amount of leakage dependent upon the amount of misalignment). Such variation in backside pressure readings based upon substrate position can be analyzed to obtain a graph similar to the plot 1106 shown in FIG. 11, where increasing off set results in decreased backside pressure readings.

Specifically, FIG. 11 depicts an illustrative graph 1100 showing an exemplary plot 1106 of substrate transfer robot hand off offset (axis 1102) versus backside pressure (axis 1104) along various hand off offset positions. The plot 1106 illustrates that a centered position of the substrate transfer robot hand off corresponds to the highest backside pressure measurement and can be determined by taking backside pressure measurements at various hand off offset positions on both sides of the centered position. Increasing offset of the substrate transfer robot in either direction results in reduced leakage and thus lower backside pressure readings. At large enough substrate transfer robot hand off offsets, the openings of the substrate moves onto the seal ring and the backside pressure will decrease rapidly, as seen by the nearly vertical portions of plot 1106. Thus, a calibrated substrate position can be found by analyzing a plurality of backside pressure values to determine a substrate position having an associated backside pressure value that is a maximum value of the plurality of backside pressure values or that is within a predetermined tolerance of the maximum value of the plurality of backside pressure values. For example, the plot of FIG. 11 shows backside pressure values that are at a maximum value at the centered hand off position. When the hand off offsets are large enough from the center hand off position, the backside pressure values decrease rapidly (as indicated by the nearly vertical portions of plot 1106 on either side of the maximum value of the backside pressure values) to values that are distinctly lower than the maximum backside pressure value as shown in FIG. 11.

For example, referring to FIG. 11, the substrate may be placed at a first hand off position of a range of hand off positions and a backside pressure measurement may be taken at the first hand off offset position (e.g., corresponding to the left-side or right-side lower backside pressure values designated as low leak at off center positions of plot 1106 of FIG. 11). The hand off offset may then be changed to various positions in one direction of the first hand off position and a backside pressure measurement may be taken at each position to obtain the plot 1106 shown in FIG. 11. The backside pressure measurements may be stopped when the plot 1106 depicts an increase in backside pressure values, a decrease in backside pressure values, a maximum backside pressure value therebetween, and continued lower backside pressure values after the decrease in backside pressure values. In another example, referring to FIG. 11, the substrate may be placed at a second hand off position of a range of hand off positions, wherein the second hand off position is near a center of the range of hand off positions. For example, as depicted in FIG. 11, such a second hand off position can have an associated backside pressure that corresponds with the high leak at center region of FIG. 11. The hand off offset may then be changed to various positions in a first direction of the second hand off position and backside pressure measurements taken at each of the various positions until the backside pressure values decrease (as indicated by the nearly vertical portion of plot 1106 on one side of high leak at center region). The hand off offset may then be changed to various position in a second direction opposite the first direction until the plot 1106 depicts a decrease in backside pressure values (as indicated by the nearly vertical portion of plot 1106 on an opposite side of the high leak at center region). A calibrated substrate position may be determined to be associated with hand off offset positions corresponding with a maximum backside pressure value or backside pressure values that are disposed between the nearly vertical portions of plot 1106 on either side of the high leak at center region.

Figure 7:
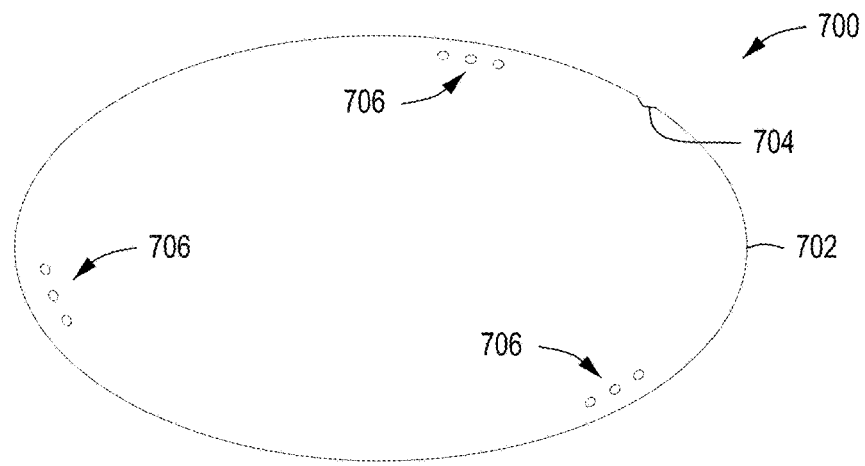
FIG. 7 is a schematic top isometric view of a substrate used in connection with a method of positioning a substrate on a substrate support in accordance with at least some embodiments of the present disclosure.
Figure 8:
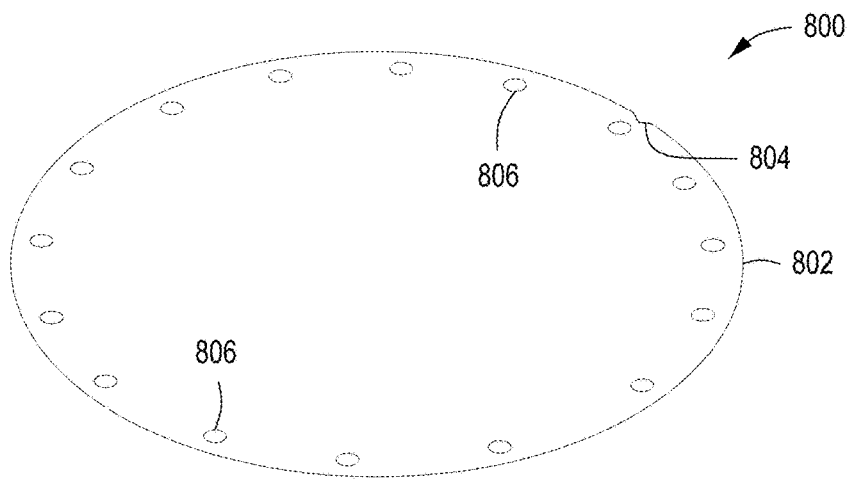
FIG. 8 is a schematic top isometric view of another substrate used in connection with a method of positioning a substrate on a substrate support in accordance with at least some embodiments of the present disclosure.
Figure 9:
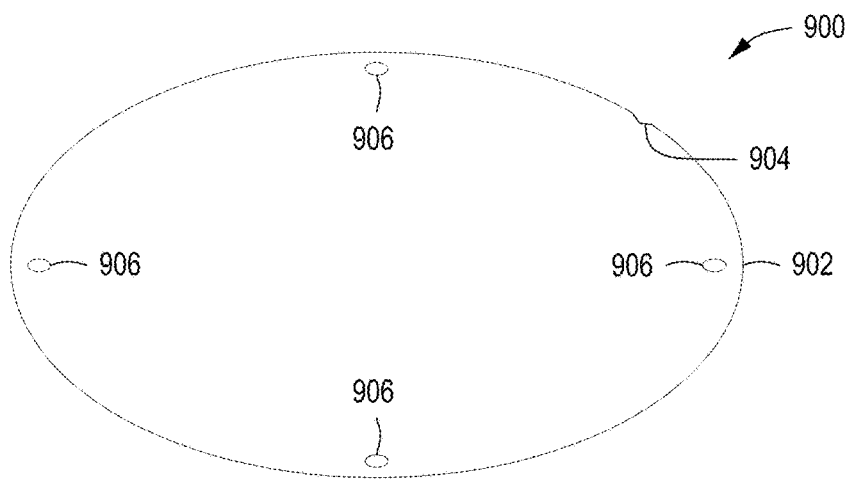
FIG. 9 is a schematic top isometric view of another substrate used in connection with a method of positioning a substrate on a substrate support in accordance with at least some embodiments of the present disclosure.

In embodiments where the calibration substrate has through holes, similar to as shown in FIGS. 5 and 6, the holes can be arranged in many different ways. The hole location, number, and diameter may be selected to obtain a desired accuracy of substrate position. For example, FIG. 7 depicts a substrate 700 including a solid disc 702 and a plurality of sets of through holes 706. The substrate may also include a notch 704 or other locating feature to facilitate substrate orientation. Although three sets of three through holes are shown, there can be greater or fewer sets of through holes and each set can have greater or fewer than three holes. The through holes may be equidistantly spaced apart within each set of through holes and the plurality of sets of through holes may be equidistantly spaced apart. Providing sets of holes advantageously allows for providing a larger open area without use of larger diameter holes which may be positioned too close to the edge of the substrate. The larger open area advantageously provides for a greater difference between leaking and sealed positions of the substrate, thus improving ease of calculating the centered position. FIG. 8 depicts a substrate 800 including a solid disc 802 and an exemplary plurality of through holes 806. Sixteen equidistantly spaced holes are shown in FIG. 18. Substrate 800 also depicts a locating notch 804. Providing a greater number of holes advantageously improves the positional accuracy of the calibration substrate. FIG. 9 depicts a substrate 900 including a solid disc 902 and an exemplary plurality of through holes 906. Four equidistantly spaced holes are shown in FIG. 9. Providing fewer holes advantageously simplifies fabrication and reduces cost of the calibration substrate. Substrate 900 also depicts a locating notch 904.

While the foregoing is directed to embodiments of the present disclosure, other and further embodiments of the disclosure may be devised without departing from the basic scope thereof.

The invention claimed is:

1. A method for positioning a substrate on a substrate support, comprising: obtaining a plurality of backside pressure values corresponding to a plurality of different substrate positions on a substrate support, by: placing a substrate in a position on the substrate support; vacuum chucking the substrate to the substrate support; measuring a backside pressure of the substrate; and repeatedly placing the substrate, vacuum chucking the substrate, and measuring the backside pressure of the substrate at the plurality of different substrate positions such that the plurality of backside pressure values decrease in backside pressure values to an absolute minimum pressure value and then increase in backside pressure values, or such that the plurality of backside pressure values increase in backside pressure values to an absolute maximum pressure value and then decrease in backside pressure values; and analyzing the plurality of backside pressure values to determine a calibrated substrate position, wherein the calibrated substrate position is associated with a backside pressure value that is at the absolute minimum pressure value or at the absolute maximum pressure value.

2. The method of claim 1, further comprising:
maintaining a pressure within a process chamber containing the substrate support above the backside pressure.

3. The method of claim 1, wherein the calibrated substrate position is with respect to centering the substrate on the substrate support.

4. The method of claim 1, wherein the plurality of different substrate positions are obtained by adjusting a hand off position of a substrate transfer robot that moves the substrate into a process chamber containing the substrate support and positions the substrate over the substrate support.

5. The method of claim 1, wherein analyzing the plurality of backside pressure values to determine the calibrated substrate position comprises determining a substrate position having an associated backside pressure value that is the absolute minimum value of the plurality of backside pressure values.

6. The method of claim 5, wherein the substrate support includes a seal ring to support an outer edge of the substrate, wherein the substrate is a solid substrate, and wherein positioning the substrate such that the outer edge of the substrate is disposed radially inward of the seal ring increases a leak rate into a region between the substrate support and a backside of the substrate.

7. The method of claim 5, wherein the substrate support includes a seal ring to support an outer edge of the substrate, wherein the substrate includes a plurality of holes disposed proximate the outer diameter of the substrate in a position that aligns with the seal ring when the substrate is centered on the substrate support, and wherein positioning the substrate such that any of the plurality of holes is disposed radially inward of the seal ring increases a leak rate into a region between the substrate support and a backside of the substrate.

8. The method of claim 1, wherein analyzing the plurality of backside pressure values to determine the calibrated substrate position comprises determining a substrate position having an associated backside pressure value that is the absolute maximum value of the plurality of backside pressure values.

9. The method of claim 8, wherein the substrate support includes a seal ring to support an outer edge of the substrate, wherein the substrate includes a plurality of holes disposed proximate the outer diameter of the substrate in a position that is disposed proximate to and radially inward of the seal ring when the substrate is centered on the substrate support, and wherein positioning the substrate such that any of the plurality of holes is disposed atop the seal ring decreases a leak rate into a region between the substrate support and a backside of the substrate.

10. The method of claim 1, further comprising maintaining the substrate support at a temperature of a subsequent process while obtaining a plurality of backside pressure values.

11. The method of claim 1, further comprising increasing a pressure within a process chamber containing the substrate support to a predefined pressure prior to measuring backside pressure.

12. The method of claim 1, further comprising, when a desired calibrated substrate position is obtained, storing the calibrated substrate position until recalibration is desired.

13. A non-transitory computer readable medium for storing computer instructions that, when executed by at least one processor causes the at least one processor to perform a method for positioning a substrate on a substrate support, comprising: obtaining a plurality of backside pressure values corresponding to a plurality of different substrate positions on a substrate support, by: placing a substrate in a position on the substrate support; vacuum chucking the substrate to the substrate support; measuring a backside pressure of the substrate; and repeatedly placing the substrate, vacuum chucking the substrate, and measuring the backside pressure of the substrate at the plurality of different substrate positions such that the plurality of backside pressure values decrease in backside pressure values to an absolute minimum pressure value and then increase in backside pressure values, or such that the plurality of backside pressure values increase in backside pressure values to an absolute maximum pressure value and then decrease in backside pressure values; and analyzing the plurality of backside pressure values to determine a calibrated substrate position, wherein the calibrated substrate position is associated with a backside pressure value that is at the absolute minimum pressure value or at the absolute maximum pressure value.

14. The non-transitory computer readable medium of claim 13, further comprising:
maintaining a pressure within a process chamber containing the substrate support above the backside pressure.

15. The non-transitory computer readable medium of claim 14, wherein maintaining the pressure within the process chamber further comprises flowing an inert gas within the process chamber.

16. The non-transitory computer readable medium of claim 13, wherein the plurality of different substrate positions are obtained by adjusting a hand off position of a substrate transfer robot that moves the substrate into a process chamber containing the substrate support and positions the substrate over the substrate support.

17. The non-transitory computer readable medium of claim 13, wherein analyzing the plurality of backside pressure values to determine the calibrated substrate position comprises determining a substrate position having an associated backside pressure value that is the absolute minimum value of the plurality of backside pressure values.

18. The non-transitory computer readable medium of claim 17, wherein the substrate support includes a seal ring to support an outer edge of the substrate, and at least one of:

wherein the substrate is a solid substrate, and wherein positioning the substrate such that the outer edge of the substrate is disposed radially inward of the seal ring increases a leak rate into a region between the substrate support and a backside of the substrate, or wherein the substrate includes a plurality of holes disposed proximate the outer diameter of the substrate in a position that aligns with the seal ring when the substrate is centered on the substrate support, and wherein positioning the substrate such that any of the plurality of holes is disposed radially inward of the seal ring increases a leak rate into a region between the substrate support and a backside of the substrate.

19. The non-transitory computer readable medium of claim 13, wherein analyzing the plurality of backside pressure values to determine the calibrated substrate position comprises determining a substrate position having an associated backside pressure value that is the absolute maximum value of the plurality of backside pressure values.

20. A method for positioning a substrate on a substrate support, comprising:

(a) placing a substrate in a position on the substrate support;

(b) vacuum chucking the substrate to the substrate support and measuring a backside pressure;

(c) repeating (a) and (b) to obtain a plurality of backside pressure values corresponding to a plurality of different substrate positions on the substrate support such that the plurality of backside pressure values decrease in backside pressure values to an absolute minimum pressure value and then increase in backside pressure values, or such that the plurality of backside pressure values increase in backside pressure values to an absolute maximum pressure value and then decrease in backside pressure values; and (d) analyzing the plurality of backside pressure values to determine a calibrated substrate position based upon the absolute minimum or the absolute maximum backside pressure value of the plurality of backside pressure values.

* * * * *